US009525391B2

(12) United States Patent
Dasgupta et al.

(10) Patent No.: US 9,525,391 B2
(45) Date of Patent: Dec. 20, 2016

(54) FULLY DIFFERENTIAL CLASS A/AB AMPLIFIER AND METHOD THEREOF

(71) Applicant: MediaTek Singapore Pte. Ltd., Singapore (SG)

(72) Inventors: Uday Dasgupta, Singapore (SG); Decheng Song, Singapore (SG); Ming Kong, Singapore (SG)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 71 days.

(21) Appl. No.: 14/197,695

(22) Filed: Mar. 5, 2014

(65) Prior Publication Data

US 2015/0256138 A1    Sep. 10, 2015

(51) Int. Cl.
*H03F 3/45* (2006.01)
*H03F 3/30* (2006.01)
*H03F 3/21* (2006.01)

(52) U.S. Cl.
CPC ........... *H03F 3/45179* (2013.01); *H03F 3/211* (2013.01); *H03F 3/3023* (2013.01); *H03F 3/45192* (2013.01); *H03F 3/45632* (2013.01); *H03F 3/45654* (2013.01); *H03F 2203/21127* (2013.01); *H03F 2203/45028* (2013.01); *H03F 2203/45051* (2013.01); *H03F 2203/45062* (2013.01); *H03F 2203/45064* (2013.01); *H03F 2203/45074* (2013.01); *H03F 2203/45082* (2013.01); *H03F 2203/45112* (2013.01); *H03F 2203/45122* (2013.01); *H03F 2203/45126* (2013.01); *H03F 2203/45134* (2013.01); *H03F 2203/45154* (2013.01); *H03F 2203/45176* (2013.01); *H03F 2203/45178* (2013.01); *H03F 2203/45194* (2013.01);

(Continued)

(58) Field of Classification Search
CPC ........................................................ H03F 3/45
USPC ................................... 330/253, 255.257–258
See application file for complete search history.

(56) References Cited

U.S. PATENT DOCUMENTS 5,216,380 A * 6/1993 Carbou ......................... 330/253
2003/0222705 A1   12/2003 Tamura et al.

OTHER PUBLICATIONS

Rabii, S., et al.; "A 1.8-V Digital-Audio Sigma-Delta Modulator in 0.8-um CMOS;" IEEE Journal of Solid-State Circuits; vol. 32; No. 6; Jun. 1997.

* cited by examiner

*Primary Examiner* — Khanh V Nguyen
*Assistant Examiner* — Khiem Nguyen
(74) *Attorney, Agent, or Firm* — McClure, Qualey & Rodack, LLP

(57) ABSTRACT

A differential amplifier and a method thereof are described. The method, adopted by a differential amplifier, includes: generating first stage differential output signals based on input differential signals; providing, by a current source, a bias current with a desired quiescent current; biasing first and second control transistors with the bias current to generate first and second currents, respectively, wherein the first and second control transistors form a differential pair which receives first stage differential input signals; mirroring the first and second currents to first and second push transistors which are connected to first and second pull transistors in series, respectively; and biasing the first and second pull transistors with the mirrored first and second currents, respectively; wherein each pair of serial connected push and pull transistors are complimentary and the two pairs of push and pull transistors output second stage differential output signals.

9 Claims, 6 Drawing Sheets

(52) U.S. Cl.
CPC ............. *H03F 2203/45244* (2013.01); *H03F 2203/45274* (2013.01); *H03F 2203/45278* (2013.01); *H03F 2203/45301* (2013.01); *H03F 2203/45302* (2013.01); *H03F 2203/45418* (2013.01); *H03F 2203/45424* (2013.01); *H03F 2203/45434* (2013.01); *H03F 2203/45642* (2013.01); *H03F 2203/45672* (2013.01); *H03F 2203/45691* (2013.01)

FULLY DIFFERENTIAL CLASS A/AB AMPLIFIER AND METHOD THEREOF

BACKGROUND OF THE INVENTION

Field of the Invention

The present invention relates to an amplifier circuit, and in particular relates to a fully differential amplifier of class A/AB type and a method thereof.

Description of the Related Art

An amplifier modulates current from a power supply responsive to an input signal. Amplifiers are divided into classes based on the circuits by which a proportion of the input signal is amplified, e.g. Class A, Class B and Class AB amplifiers.

For a Class A amplifier, the active element remains active over the entire conduction cycle of the input signal, consuming power almost all the time. As for a Class B amplifier, the active element remains active over the half of the conduction cycle, and the distortion in the output signal thereof is noticeable.

A Class AB amplifier is an amplifier which contains push and pull devices, each is biased to conduct more than half of the conduction cycle, reducing cross-over clipping of a Class B amplifier at the expense of an increased power consumption associated with a Class A amplifier. The increased power consumption arises from what is known as a "quiescent current" of the Class AB amplifier, which flows from positive to negative power supplies through both the push and pull devices in the absence of the input signal. The Class AB type amplifier requires only small amounts of quiescent currents to reduce cross-over distortion considerably, therefore are widely adopted in audio, signal processing, and radio frequency applications.

Accordingly, the choices of the quiescent currents impact considerably on the level of distortion and the power efficiency. When the push and pull devices of the Class AB amplifier are operated by voltage biasing, the quiescent currents through the push and pull devices are determined by bias voltages, device process, temperature, and power-supply voltage variation. The mismatched quiescent currents through the push and pull devices may lead to circuit performance degradation such as increased common mode DC offsets and increased differential mode DC offsets.

BRIEF SUMMARY OF THE INVENTION

A detailed description is given in the following embodiments with reference to the accompanying drawings.

An embodiment of a differential amplifier is described, comprising a first amplifier stage, a bias circuit and a second amplifier stage. The first amplifier stage is configured to generate first stage differential output signals based on input differential signals. The bias circuit, coupled to the first amplifier stage and a ground, comprising a bias current source and first and second control transistors coupled to the ground through the bias current source, is configured to provide a bias current with a desired quiescent current level by the bias current source, and bias the first and second control transistors with the bias current to generate first and second currents, respectively, wherein the first and second control transistors form a differential pair which receives the first stage differential input signals. The second amplifier stage, coupled to the bias circuit, comprising first and second output amplifier stages outputting second stage differential output signals, wherein each of the first and second output amplifier stages comprises complementary push and pull transistors coupled in series to each other, and a mirror transistor coupled to the push transistors, the mirror transistor mirrors one of the first and second currents to the push device, and the mirrored current serves to bias the pull transistor.

Another embodiment of a method of amplifying a signal is disclosed, adopted by a differential amplifier, comprising: generating first stage differential output signals based on input differential signals; providing, by a current source, a bias current with a desired quiescent current; biasing first and second control transistors with the bias current to generate first and second currents, respectively, wherein the first and second control transistors form a differential pair which receives first stage differential input signals; mirroring the first and second currents to first and second push transistors which are connected to first and second pull transistors in series, respectively; and biasing the first and second pull transistors with the mirrored first and second currents from the first and second push transistors, respectively; wherein each pair of serial connected push and pull transistors are complimentary and the two pairs of push and pull transistors output second stage differential output signals.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The exemplary amplifier circuit described below employs complementary transistor types, i.e. "npn" and "pnp" transistor types, or referred to as N and P-type devices respectively. In a bipolar junction transistor (BJT) the transistor types refer to the semiconductor material and hence majority charge carrier from which each region of the BJT, i.e. the emitter, base, and collector are made. Similarly in a field effect transistor (FET) the three letters refer to the semiconductor material and majority charge carrier from which the drain, substrate, and source are made. The N and P-type devices are said to be complementary in that their switching characteristics are complementary. The P-type device, or "pnp" type device is generally "On" and conducting when the base of a BJT or the gate of a FET is pulled low.

Conversely, the N-type device, or "npn" type device is generally "On" and conducting when the base of a BJT or the gate of a FET is pulled high.

The embodiments shown in the disclosure only serve to illustrate the principle of the invention, the actual implementation is not limited to the circuit configuration shown in the embodiments. In particularly, the polarities of the transistor devices in the embodiments are interchangeable to realize the principle of the invention and meet various design preferences. Further, the BJT devices may be used in place of the FET devices in the embodiments to realize the invention.

In the following disclosure, a power supply is labeled $V_{DD}$ and provided at a fixed voltage potential such as 3V, 5V, or other values. The ground is fixed at a voltage potential of 0V. Output loads connected to the output nodes OUTM and OUTP of the embodiments are generally grounded with the same ground used by the amplifier circuits of the embodiments.

Figure 1:
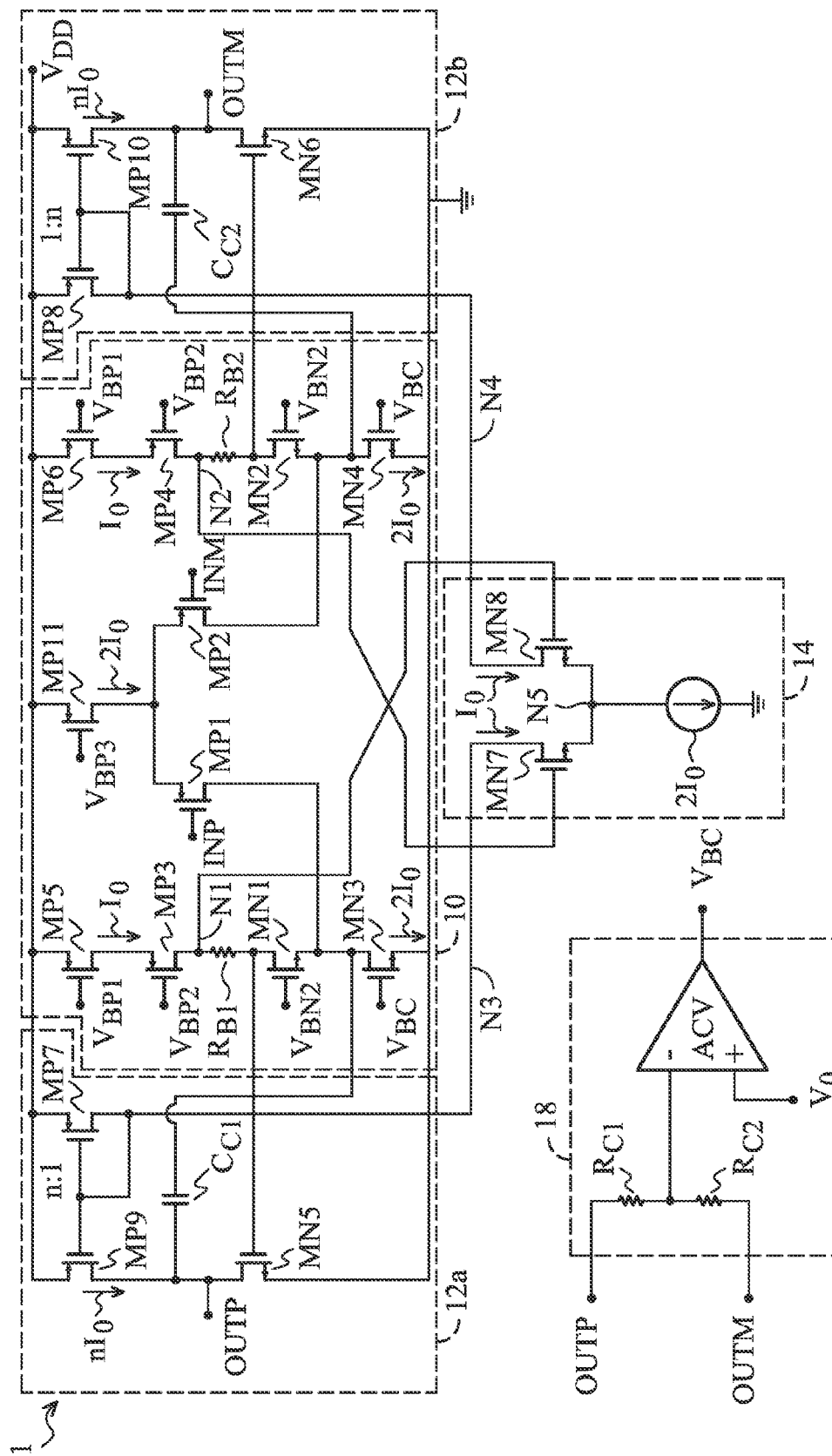
FIG. 1 is a circuit schematic of a class A/AB amplifier 1 according to an embodiment of the invention.

FIG. 1 is a circuit schematic of a class A/AB amplifier 1 according to an embodiment of the invention, containing a first amplifier stage 10, a second amplifier stage 12, a bias circuit 14 and a voltage common-mode feedback circuit 18. The first amplifier stage 10 and the second amplifier stage 12 are coupled to the bias circuit 14. The voltage common-mode feedback circuit 18 is coupled to the first amplifier stage 10 and the second amplifier stage 12 to correct the common mode voltage.

The amplifier 1 is a differential amplifier which receives a pair of differential inputs signals INM and INP and generates a pair of second stage differential output signals OUTM and OUTP. The differential inputs signals are amplified in two stages to produce the second stage differential output signals, with the second amplifier stage 12 being configured as the class AB type amplifier. The bias circuit 14 is configured to deliver equal quiescent currents to push and pull transistors of the second amplifier stage 12. The amplifier 1 may be adopted in an integrated circuit or a discrete circuit for various applications in audio, video, communication, computing, and signal processing systems.

The first amplifier stage 10 employs folded cascode architecture, and the second amplifier stage 12 includes a current mirror and a push-pull configuration. The first amplifier stage 10 receives the differential inputs signals INM and INP and outputs first stage differential output signals at nodes N1 and N2. The folded cascode architecture is adopted to provide high frequency response with a moderate gain. The differential inputs signals INM and INP may be audio signals, radio frequency signals, or analog signals that are to be signal processed in a converter or a frequency synthesizer.

The first amplifier stage 10 includes transistors MP1, MP2, MP3, MP4, MP5, MP6, MN1, MN2, MN3, MN4, and MP11. The transistors MP1 and MP2 form a differential pair which serves as input driver transistors, and the transistors MN1 and MN2 form the folded cascode transistors. The common mode feedback is accomplished by the bias voltages $V_{BC}$ of the transistors MN3 and MN4. In operation, the input driver transistors MP1 and MP2 and the cascode transistors MN1 and MN2 amplify the differential inputs signals INM and INP to generate the first stage differential output signals $V_{N1}$ and $V_{N2}$ at nodes N1 and N2, which are subsequently delivered to the bias circuit 14.

The second amplifier stage 12 contains a first output amplifier stage 12a and a second output amplifier stage 12b, where the first output amplifier stage 12a includes a mirror transistor MP7, a push transistor MP9 and a pull transistor MN5, and a capacitor $C_{C1}$, and the second output amplifier stage 12b includes a mirror transistor MP8, a push transistor MP10 and a pull transistor MN6, and a capacitor $C_{C2}$. The output nodes are respectively coupled to a complementary pair of push and pull transistors MP9 and MN5, and MP10 and MN6, both transistor pairs form main components in the second amplifier stage 12. The push and pull transistors MP9 and MN5, and MP10 and MN6 are coupled in series between a ground and a power supply. The transistor pair MP7 and MP9 and the transistor pair MP8 and MP10 each form a current mirror. The transistors MP7 and MP8 are of the same size and type as the transistors MP9 and MP10, or of a fixed ratio n different from the transistors MP9 and MP10, such that the currents flow through the transistors MP7 and MP8 either match the currents through the transistors MP9 and MP10, or are a fixed ratio n thereof.

The second amplifier stage 12 is biased by a bias current output from the bias circuit 14. The bias circuit 14 contains a differential pair of first and second control transistors MN7 and MN8 and a tail current source which carries a fixed tail current and provides first and second bias currents of the current level $I_0$ to the transistors MN7 and MN8 each. The tail current source may be connected to the first and second control transistors MN7 and MN8 in series or in parallel to provide the current biasing thereto, as depicted by the embodiments in FIG. 2 and FIG. 4. When no input differential signal pair INM and INP is present, the transistors MN7 and MN8 then respectively output third and fourth currents $I_{N3}$ and $I_{N4}$ with the current level $I_0$ to the mirror transistors MP7 and MP8 of the second amplifier stage 12.

In turn, the mirror transistors MP7 and MP8, which connect in series to the transistors MN7 and MN8, also carry third and fourth currents $I_{N3}$ and $I_{N4}$ with the current level $I_0$. The current mirrors then copy the third and fourth currents $I_{N3}$ and $I_{N4}$ to the push transistors MP9 and MP10, resulting in mirrored currents of the current level $nI_0$, where n is the size ratio of the push transistors MP9/MP10 to the mirror transistors MP7/MP8. The mirrored currents $nI_0$ also serve to bias the pull transistors MN5 and MN6. Since the nodes N1 and N2 are not forced to a bias voltage and do not have any role in determining the bias current in the output pull transistors MN5 and MN6, the transistors MN5 and MN6 simply carry the mirrored currents $nI_0$ supplied by the push transistors MP9 and MP10 without any alternation. As a result, the push transistor MP9/MP10 and the pull transistor MN5/MN6 carry equal quiescent currents. The current level $nI_0$ is the desired quiescent current carried by the push transistor MP9/MP10 and the pull transistor MN5/MN6 of the second amplifier stage 12 in the absence of the differential inputs signals INM and INP. The fixed tail current generated by the tail current source may have a current level of $2I_0$.

In operation, the control transistors MN7 and MN8, biased by the first and second bias currents $I_0$, are configured to receive the first stage differential output signals $V_{N1}$ and $V_{N2}$ from the first stage amplifier 10 to generate third and fourth currents $I_{N3}$ and $I_{N4}$ that are in proportion to the received first stage differential output signals $V_{N1}$ and $V_{N2}$, respectively. Subsequently, the transistor MP7 and MP8 mirror the third and fourth currents $I_{N3}$ and $I_{N4}$ to the push transistors MP9 and MP10, respectively, thereby pushing proportionated amounts of mirrored currents $nI_{N3}$ and $nI_{N4}$ from the power supply $V_{DD}$ onto the output node to generate the second stage differential output signals OUTM and OUTP, respectively. The push transistors MP9 and MP10 only draw significant currents over approximately 180 degrees of the differential inputs signals INM and INP. The currents during remaining portions of the differential input signal cycle approach the quiescent current level $nI_0$. Conversely, the negative portion of the biased differential input signal OUTM and OUTP activates primarily the pull transistors MN5 and MN6, thereby pulling proportionate amounts of the current to the ground from the output node to generate the resultant second stage differential output signals OUTM and OUTP. The biasing the pull transistors MN5 and MN6 are supplied by the quiescent currents $nI_0$ from the push transistors MP9 and MP10 respectively.

Figure 2:
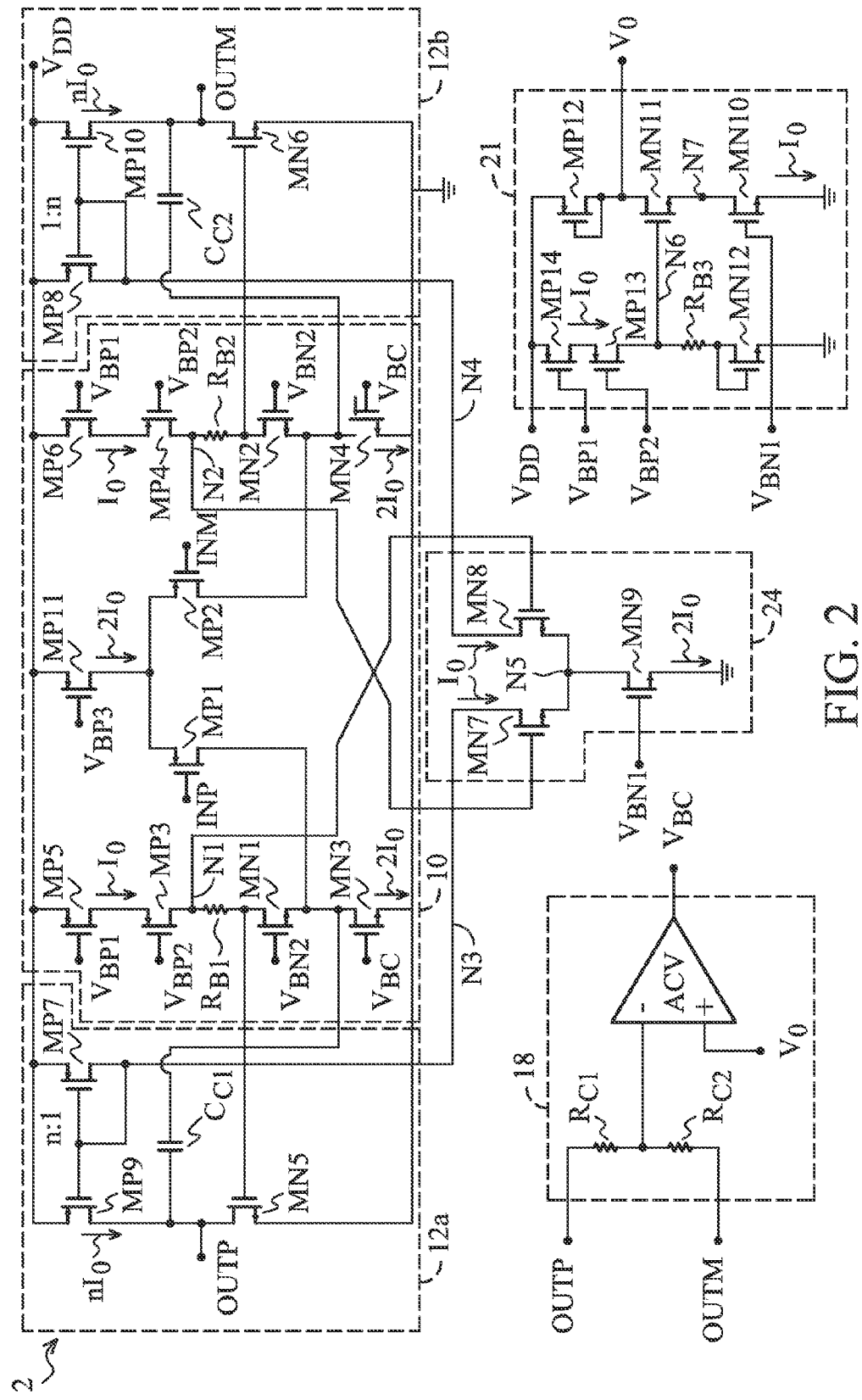
FIG. 2 is a circuit schematic of a class A/AB amplifier 2 according to another embodiment of the invention.
Figure 3:
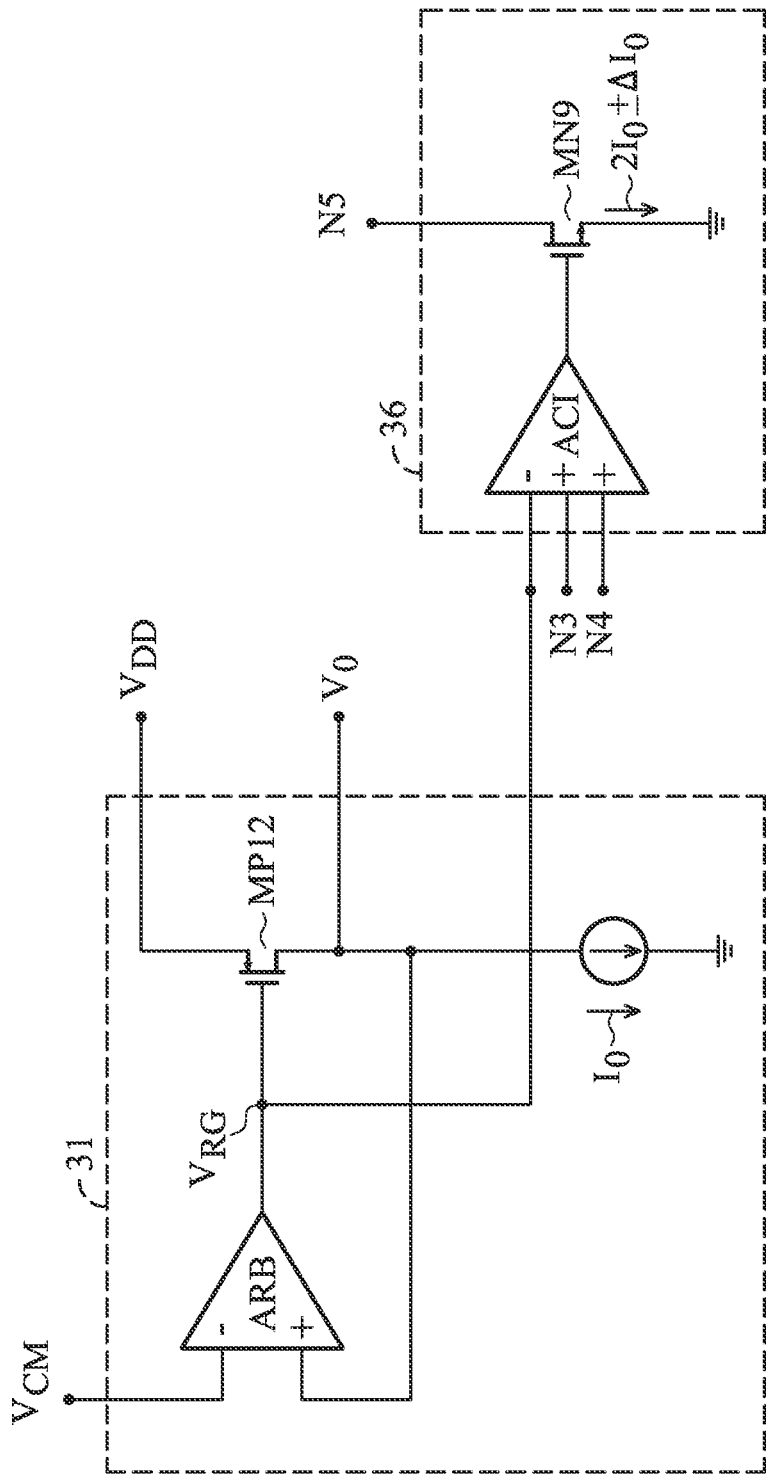
FIG. 3 is a circuit schematic of a voltage common mode circuit 31 and a bias circuit 36 which may be incorporated into the class A/AB amplifier 1.

The output voltage common mode correction is provided by an internal feedback loop from the second amplifier stage 12, through the voltage common mode circuit 18, to the first amplifier stage 10. The voltage common mode circuit 18 contains a voltage common mode amplifier $A_{CV}$ and first and second resistors $R_{C1}$ and $R_{C2}$. The first and second resistors $R_{C1}$ and $R_{C2}$ are connected in parallel, and receive the second stage differential output signals OUTM and OUTP respectively. In some embodiments, the first and second resistors $R_{C1}$ and $R_{C2}$ have substantially the same resistances, and are configured to calculate an average of the second stage differential output signals OUTM and OUTP. The voltage common mode amplifier $A_{CV}$ is connected to the first and second resistors $R_{C1}$ and $R_{C2}$ to set the averaged voltage of the second stage differential output signals OUTM and OUTP to a reference voltage $V_0$ by feeding back a difference of the averaged voltage and the reference voltage $V_0$ as the bias voltages $V_{BC}$ to the transistors MN3 and MN4 of the first amplifier stage 10, which in turn adjust the first stage differential output signals $V_{N1}$ and $V_{N2}$ at the nodes N1 and N2, subsequently causing a change in the second stage differential output signals OUTM and OUTP. The reference voltage $V_0$ may be held at a reference potential $V_{CM}$, which may be an analog ground that can increase or maximize output signal swing. The reference voltage $V_0$ may also be generated by a replica bias circuit, as depicted in FIG. 2. The reference voltage $V_0$ may also be configured externally to an arbitrary value that is less than the power supply $V_{DD}$, as depicted in FIG. 3.

In addition, the voltages VBP1, VBP2, VBP3, and VBN2 are bias voltages that are generated with a bias voltage generation circuit that are not shown here and supplied to the first amplifier stage 10 and the bias circuit 14.

The class A/AB amplifier 1 employs a bias circuit 14 to provide current biasing to the second stage amplifier, rendering constant and equal quiescent currents through the push and pull transistors of the second stage amplifier, reducing common mode and differential mode DC offset and increasing signal noise rejection. The class A/AB amplifier 1 is suitable for low-voltage applications, the quiescent currents of the second amplifier stage are set accurately.

FIG. 2 is a circuit schematic of a class A/AB amplifier 2 according to another embodiment of the invention, where the bias circuit 24 is implemented by a transistor MN9 that is connected in series with the first and second control transistors MN7 and MN8 at a node N5, and the reference voltage $V_0$ is generated by a reference voltage generation circuit 21.

The bias transistor MN9 serves as a current source which carries a constant current $2I_0$, providing the current biasing with the quiescent current $I_0$ to the first and second control transistors MN7 and MN8. The bias voltage VBN1 is also generated by the bias voltage generation circuit as described in the preceding section. In order to provide required DC voltage drop across the bias transistor MN9, level shift resistors RB1 and RB2 are inserted in the first amplifier stage to provide the required DC shifted levels at the nodes N1 and N2. The level shift resistors RB1 and RB2 have substantially the same resistance.

The reference voltage generation circuit 21 is configured to generate the reference voltage $V_0$ for the voltage common mode circuit 18 to correct the common mode voltage. The reference voltage generation circuit 21 is a replica bias circuit which contains the same circuit configuration as the biased circuit, i.e., the first and second amplifier stages. Specifically, the reference voltage generation circuit 21 includes transistors MP14, MP13, MN12, MP12, MN11, and MN10 and a resistor RB3, where the transistors MP14, MP13, MN12, MP12, MN11, MN10, the resistor RB3, and nodes N6 and N7 respectively replicate the transistors MP5/MP6, MP3/MP4, MN5/MN6, MP7/MP8, MN7/MN8, MN9, the resistor RB1/RB2, and the nodes N1/N2, and N5 of the first and second amplifier stages.

With the circuit arrangement of the reference voltage generation circuit 21, the reference voltage $V_0$ replicates the voltages $V_{N3}/V_{N4}$ at the nodes N3/N4, the voltage common mode circuit 18 is configured to match the average of the second stage differential output signals OUTM and OUTP to the replicated reference voltage $V_0$ by feeding back the difference of the averaged voltage and the reference voltage $V_0$ to the transistors MN3 and MN4 and adjusting the voltages $V_{N1}$ and $V_{N2}$ at the nodes N1 and N2 until the second stage differential output signals OUTM and OUTP are substantially the same as the reference voltage $V_0$, or the voltages $V_{N3}/V_{N4}$ at the nodes N3/N4. After the common mode correction, the voltage OUTP, OUTM, $V_{N3}$ and $V_{N4}$ are all set to the reference voltage $V_0$. As a consequence, the drain-source voltages of the transistors MP9 and MP10 are the exactly same as those of the transistors MP7/MP8. Therefore when the quiescent currents of the transistors MP7 and MP8 are $I_0$, the quiescent currents of the transistors MP9 and MP10 can be accurately set to $nI_0$.

The class A/AB amplifier 2 employs a bias circuit 24 to provide equal and constant quiescent current to the push and pull transistors of the amplifier output stage and a reference voltage generation circuit 21 to provide output voltage common mode correction, reducing common mode and differential mode DC offset and increasing signal noise rejection.

FIG. 3 is a circuit schematic of a voltage common mode circuit 31 and a bias circuit 36 which can be incorporated into the class A/AB amplifier 1. The embodiment of FIG. 3 is distinct from that of FIG. 2 in that the voltage common mode circuit 31 and the bias circuit 36 replace the voltage common mode circuit 21 and the bias circuit 24.

The voltage common mode circuit 31 contains a first voltage feed around amplifier $A_{RB}$, a transistor MP12 and a current source. The current source is configured to carry the desired quiescent current level $I_0$ and connected to the drain of the transistor MP12. Referring to FIG. 1 and FIG. 3, the transistor MP12 in FIG. 3 can be regarded as a replica of the transistor MP7/MP8 in FIG. 1, biased by a fixed current $I_0$ supplied by the current source. In some embodiment, the current source may be realized by a transistor biased to carry a constant current of a current level $I_0$. The first voltage feed around amplifier $A_{RB}$ is configured to receive an externally applied reference voltage $V_{CM}$ and the drain voltage of the transistor MP12, thereby setting the drain voltage $V_0$ of the transistor MP12 to be equal to the externally applied reference voltage $V_{CM}$, and supplying the drain voltage $V_0$ of the transistor MP12 to the voltage common mode circuit 18, where the drain voltage $V_0$ is used as a reference to set the voltage levels of the second stage differential output signals OUTM and OUTP.

The bias circuit 36 contains a first current feedback amplifier $A_{CI}$ and a transistor MN9. The first current feedback amplifier $A_{CI}$ is configured to set the voltages $V_{N3}$ and $V_{N4}$ at the nodes N3 and N4 to the gate voltage $V_{RG}$ of the transistor MP12 by outputting an output voltage thereof to adjust the current carried by the transistor MN9 to $(2I_0 \pm \Delta I_0)$, where the output voltage of the first current feedback amplifier $A_{CI}$ represents a voltage difference of the voltages $V_{N3}$ and $V_{N4}$ and the target gate voltage $V_{RG}$, and the current component $\pm \Delta I_0$ is proportional to the voltage difference between the voltages $V_{N3}$ and $V_{N4}$ and the target gate voltage $V_{RG}$. The bias circuit 36 may be used in place of the current source of the bias circuit 14 of the amplifier 1 in FIG. 1, the transistor MN9 is configured to supply bias currents $(2I_0 \pm \Delta I_0)/2$ to the control transistors MN7 and MN8, which in turn change the drain voltages $V_{N3}$ and $V_{N4}$ thereof, thereby setting the voltages $V_{N3}$ and $V_{N4}$ to the target gate voltage $V_{RG}$.

Accordingly, the second stage differential output signals OUTM and OUTP are set to the external applied reference voltage $V_{CM}$ by the first voltage feed around amplifier $A_{RB}$, the voltages $V_{N3}$ and $V_{N4}$ at the nodes N3 and N4 are set to the gate voltage $V_{RG}$ of the transistor MP12 by the first current feedback amplifier $A_{CI}$, consequently, the gate and drain voltages of the transistors MP9 and MP10 of the second amplifier stage 12 are set equal to those of the transistors MP12 of the voltage common mode circuit 31, therefore the quiescent currents through the transistors MP9 and MP10 are accurately set to $nI_0$. The external applied reference voltage $V_{CM}$, and thus the second stage differential output signals OUTM and OUTP, can be set to any voltage level that is less than or any fraction of the power supply $V_{DD}$.

In comparison to the amplifier 2 in FIG. 2, the embodiment in FIG. 3 offers greater flexibility in choosing the common mode voltage $V_{CM}$. In the embodiment in FIG. 2, the reference voltage $V_0$ is taken from the drain voltage of the transistor MP12, and is fixed at one $V_{GS}$ drop below the power supply $V_{DD}$, i.e., $(V_{DD}-V_{GS})$. In other embodiments, the N-type and P-type transistors are interchanged so that the reference voltage $V_0$ is fixed at one $V_{GS}$ above the ground potential i.e., $(V_{GS})$. Whereas in the embodiment in FIG. 3, the reference voltage $V_0$ is forced to the external applied common mode voltage $V_{CM}$, which may be set to any desired value that is less than the power supply $V_{DD}$. Therefore, the circuit configuration in FIG. 3 allows the amplifier to operate with a greater range of selection for the common mode voltage $V_{CM}$.

The embodiment in FIG. 3 employs a voltage common mode circuit 31 and the bias circuit 36 to set the second stage differential output signals OUTM and OUTP to an external applied common mode voltage $V_{CM}$, providing flexibility for choosing the common mode voltage and resulting in the quiescent currents of the transistors MP9 and MP10 being set accurately to the desired $nI_0$.

Figure 4:
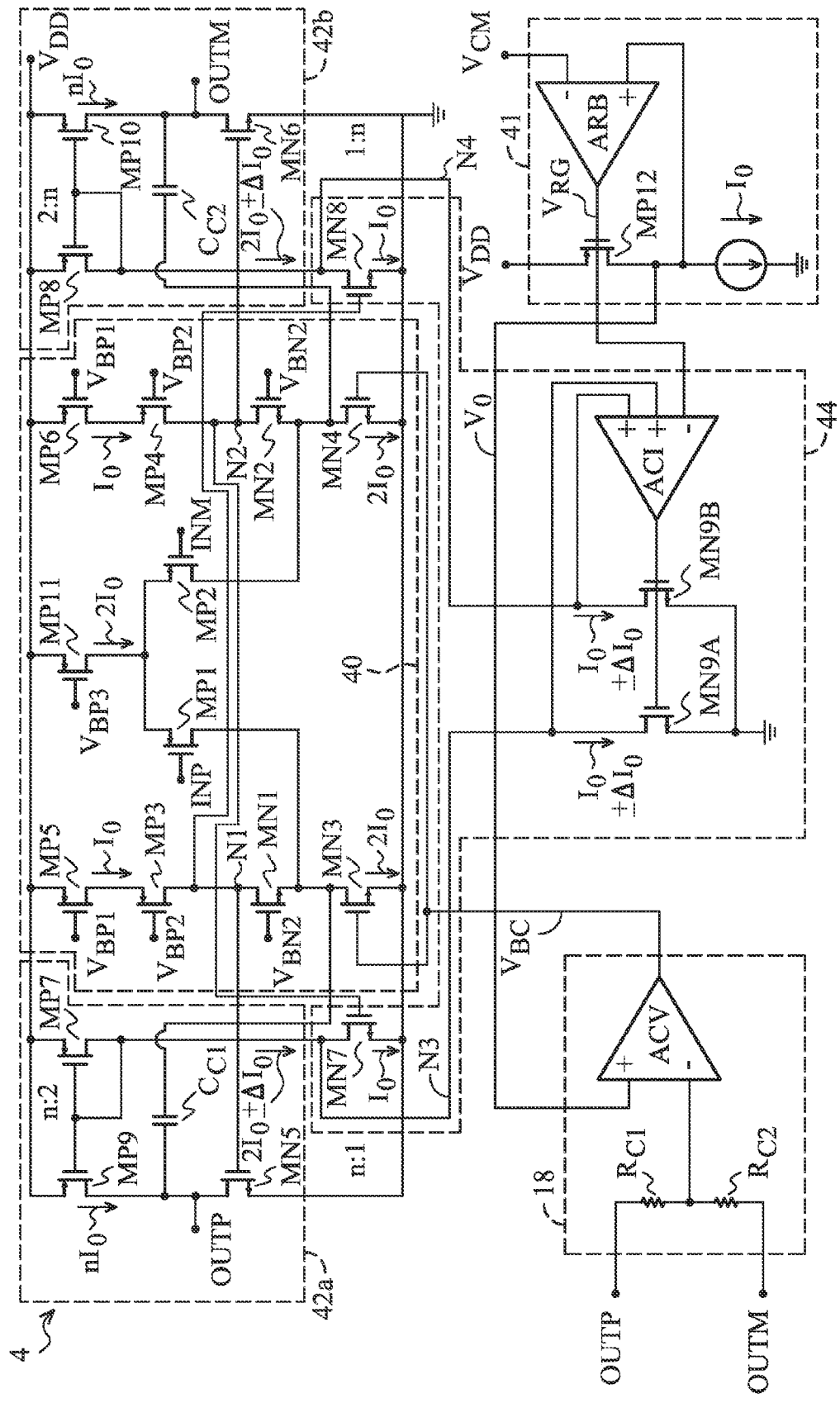
FIG. 4 is a circuit schematic of a class AB amplifier 4 according to yet another embodiment of the invention.

FIG. 4 is a circuit schematic of a Class AB amplifier 4 according to yet another embodiment of the invention, comprising a first amplifier stage 40, a second amplifier stage 42, a bias circuit 44 and a voltage common-mode feedback circuit 18. The embodiment in FIG. 4 adopts the circuit configuration for the voltage common mode correction in FIG. 3. The embodiment in FIG. 4 is different from the embodiments in FIG. 2 and FIG. 3 in the circuit configuration and connection of the first amplifier stage 40, the second amplifier stage 42, and the bias circuit 44.

Referring to FIG. 2 and FIG. 4, the transistor MN9 of the bias circuit 16 in FIG. 2 is split into two equal sized transistors MN9A and MN9B of the bias circuit 44. The first and second control transistors MN7 and MN8 are parallel connected to the transistors MN9A and MN9B to the ground, respectively. That is, rather than connecting to the ground through the transistor MN9 in FIG. 2, the sources of the first and second control transistors MN7 and MN8 are connected directly to the ground. Because the first and second control transistors MN7 and MN8 no longer stack on the transistor MN9, the level shift resistors RB1 and RB2 are not needed in the first amplifier stage 40 for providing the required voltage for the transistor MN9. In addition, the transistors MN9A and MN9B are biased to act as current sources, each carries a current of $(I_0 \pm \Delta I_0)$.

Further, in the second amplifier stage 42, the size ratio of the transistors MP9 to the MP7 and MP10 to the MP8 are n:2, and the size ratio of the transistors MN5 to the MN7 and MN6 to the MN8 are n:1, where n is an integer. Therefore, the quiescent currents carried by the mirror transistors MP7 and MP8 are $2I_0$, the quiescent currents carried by the first and second control transistors MN7 and MN8 are $I_0$, the quiescent currents carried by the split bias transistors MN9A and MN9B are $I_0$, the quiescent currents carried by the push transistors MP9 and MP10 and the pull transistors MN5 and MN6 are maintained at current level $nI_0$ using the amplifiers $A_{CI}$ and $A_{RB}$, as explained in FIG. 3. The voltage common mode at the differential output signals OUTM and OUTP are maintained by the voltage common mode circuit 18 and the reference voltage generation circuit 41 as explained in the embodiment in FIG. 3.

With the sources being connected to the ground, the first and second control transistors MN7 and MN8 can deliver increased currents into the mirror transistors MP7 and MP8, thereby allowing the push transistors MP9 and MP10, in turn, to deliver increased currents into the load at the second stage differential output signals OUTM and OUTP. In operation, the circuit arrangement in FIG. 2 allows the pull transistors MN5 and MN6 to deliver currents much larger than those can be delivered by the push transistors MP9 and MP10, which are limited to $2nI_0$ since the maximum currents that can be delivered by the transistors MP7 and MP8 are $2I_0$. As a consequence, the amplifier 2 is a class A/AB amplifier. In comparison, the circuit arrangement in FIG. 4 permits the push transistors MP9 and MP10 and the pull transistors MN5 and MN6 to deliver large amounts of currents into the load at the nodes OUTP and OUTM, since the first and second control transistors MN7 and MN8 are now also directly connected to the ground, resulting in a Class AB topology.

Although the amplifier 4 employ the feedback around approach for the voltage common mode circuit 41 to set the common mode voltage and the bias circuit 44 to determine the bias current, it should be apparent to those skilled in the art that the bias circuit 24 and the replica bias circuit 21 may be used in place of the bias circuit 44 and the voltage common mode circuit 41, with the single bias transistor MN9 in bias circuit 24 being split into two bias transistors MN9A and MN9B and connected in parallel to the first and second control transistors MN7 and MN8.

The amplifier 4 in FIG. 4 employs the bias circuit 44 to provide equal maximum driving current and equal quiescent current for the push and pull transistors in the second amplifier stage, rendering a pure Class AB amplifier.

Figure 5:
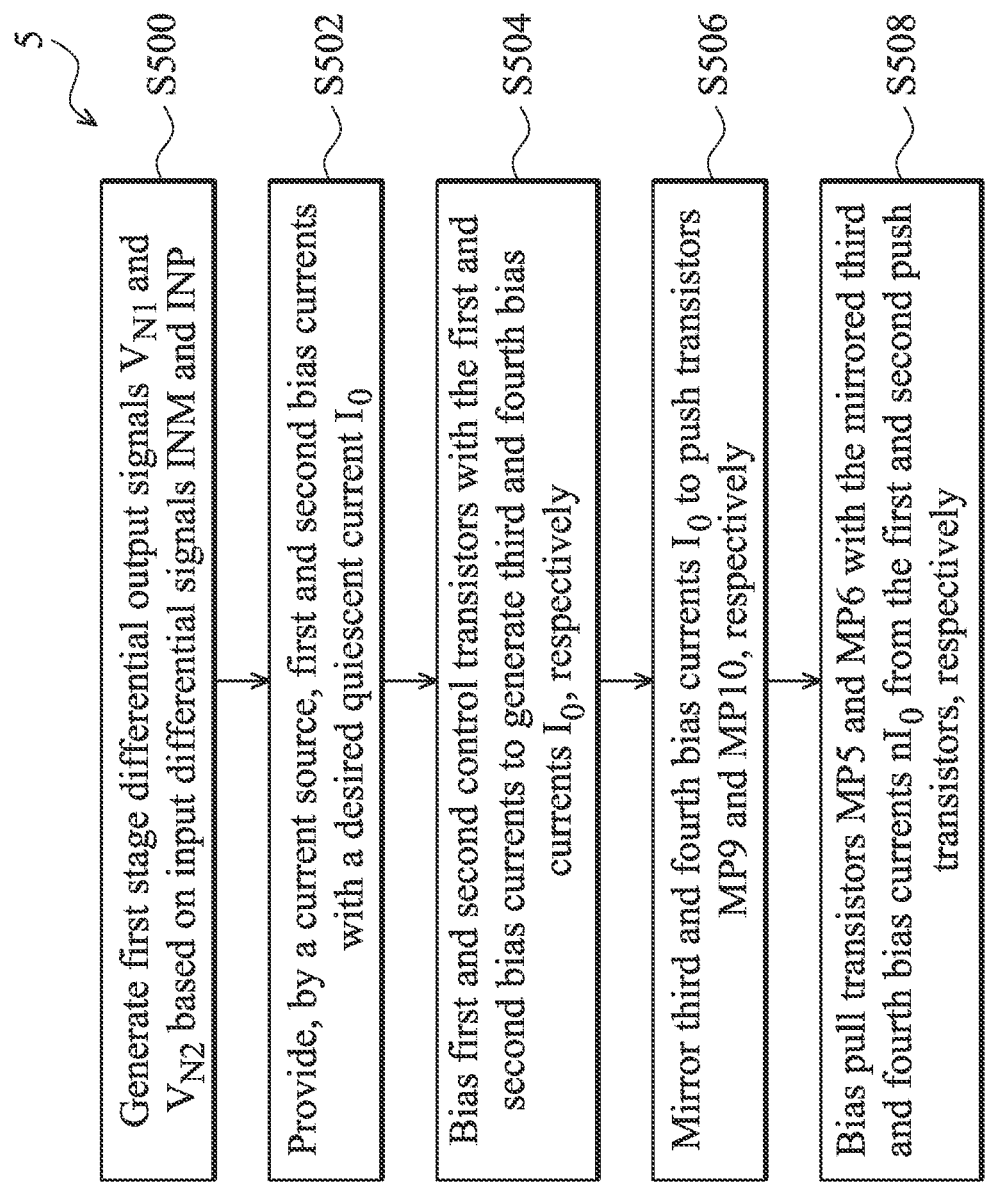
FIG. 5 is a flowchart of a control method 5 according to an embodiment of the invention.

FIG. 5 is a flowchart of a control method 5 according to an embodiment of the invention, incorporating the amplifier in FIGS. 1 through 4.

Upon startup of the control method 5, the amplifier is initialized to receive the input differential signals INM and INP and generate the first stage differential output signals $V_{N1}$ and $V_{N2}$ at the node N1 and N2 by a first stage amplifier (S500). The first amplifier may be configured as the folded cascode configuration.

Meanwhile, in the bias circuit, a current source is configured to provide first and second bias current to bias the first and second control transistors MN7 and MN8 with a desired quiescent current level $I_0$ (S502). The current source, connected to the first and second control transistors MN7 and MN8 and the ground, may be connected in series or in parallel with the first and second control transistors MN7 and MN8, as depicted in FIG. 2 and FIG. 4 respectively.

In the bias circuit, the first and second bias currents, both have substantially the same quiescent current level $I_0$, are utilized to bias the first and second control transistors MN7 and MN8 to generate third and fourth bias currents $I_{N3}$ and $I_{N4}$ respectively (S504), wherein the third and fourth bias currents $I_{N3}$ and $I_{N4}$ also have the desired quiescent current level $I_0$. In some embodiments, the differential transistor pair MN7 and MN8 is connected to the ground through the current source, the bias circuit contains a transistor MN9 biased to carry a current of $2I_0$, which bias the first and second control transistors MN7 and MN8 each with the first and second bias currents $I_0$. In other embodiments, the differential transistor pair MN7 and MN8 is connected in parallel with the current source to the ground, the bias circuit contains two transistors MN9A and MN9B, each is biased to carry a desired quiescent current level $I_0$, which respectively biases the first and second control transistors MN7 and MN8 each with the first and second bias currents $I_0$.

The third and fourth bias currents $I_{N3}$ and $I_{N4}$ are then delivered to the second stage amplifier and mirrored by the transistors MP7 and MP9 to push transistors MP9 and MP10, respectively (S506), wherein the mirrored currents are of a ratio n of the third and fourth bias current level $I_0$. The push transistors MP9 and MP10 respectively carry the mirrored third and fourth bias current $nI_0$, which also serve to bias the pull transistors MN5 and MN6 respectively (S508). As a consequence, the push and pull transistors carry in each output pair of the second amplifier stage carry equal quiescent currents. When the push and pull transistors in the second amplifier stage carry substantially the same quiescent currents of the current level $nI_0$, the common mode and differential mode DC offset can be more accurately controlled and reduced, enhancing the circuit performance of the Class AB amplifier.

The control method 5 utilizes current biasing to the second amplifier stage, resulting in equal quiescent currents of the push and pull transistors of the second amplifier stage, reducing common mode and differential mode DC offset and increasing circuit performance.

Figure 6:
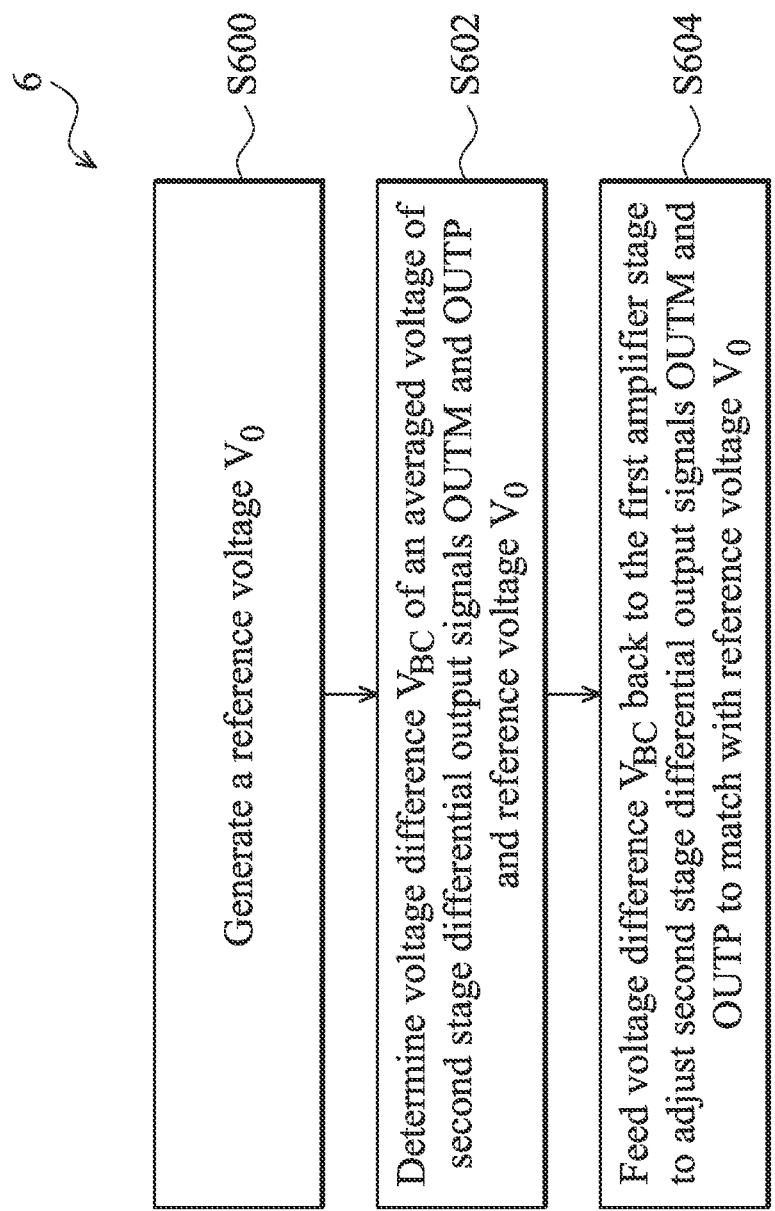
FIG. 6 is a flowchart of a control method 6 according to an embodiment of the invention.

FIG. 6 is a flowchart of a control method 6 according to an embodiment of the invention, incorporating the differential amplifier in FIGS. 1 through 4.

The control method 6 is utilized to provide output voltage common mode correction. Upon startup of the control method 6, the differential amplifier is initialized and a reference voltage $V_0$ is generated as a reference for the output voltage common mode correction (S600). The reference voltage $V_0$ may be fixed at a voltage level $(V_{DD}-V_{th})$ or $(V_{th})$ when a replica bias circuit as in FIG. 2 is adopted, or may be adaptable to be any desired voltage level that is less than power supply $V_{DD}$ when a feedback amplifier as in FIGS. 3 and 4 is implemented.

The second stage differential output signals OUTM and OUTP are then averaged and compared to the reference voltage $V_0$ by a voltage common-mode feedback circuit to determine a voltage difference $V_{BC}$ therebetween (S602).

Subsequently, the voltage common mode of the differential output signals OUTM and OUTP is reduced or removed by feeding back the voltage difference $V_{BC}$ to the first amplifier stage, which subsequently adjusts the first stage differential output signals $V_{N1}$ and $V_{N2}$, thereby changing the second stage differential output signals OUTM and OUTP (S604). This process will continue until the average of the differential output signals OUTM and OUTP matches to the reference voltage $V_0$.

Using the control method 6, the second stage differential output signals OUTM and OUTP can be accurately set to the reference voltage $V_0$, reducing or removing the common mode voltage offset from the second stage differential output signals OUTM and OUTP.

As used herein, the term "determining" encompasses calculating, computing, processing, deriving, investigating, looking up (e.g., looking up in a table, a database or another data structure), ascertaining and the like. Also, "determining" may include resolving, selecting, choosing, establishing and the like.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, micro controller or state machine.

The operations and functions of the various logical blocks, modules, and circuits described herein may be implemented in circuit hardware or embedded software codes that can be accessed and executed by a processor.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A differential amplifier, comprising:
    a first amplifier stage, configured to generate first stage differential output signals based on input differential signals;
    a bias circuit, coupled to the first amplifier stage and a ground, comprising a bias current source and first and second control transistors coupled to the ground through the bias current source, configured to provide a bias current with a desired quiescent current level by the bias current source, and bias the first and second control transistors with the bias current to generate first and second currents, respectively, wherein the first and second control transistors form a differential pair which receives the first stage differential output signals; and
    a second amplifier stage, coupled to the bias circuit, comprising first and second output amplifier stages outputting second stage differential output signals, wherein each of the first and second output amplifier stages comprises complementary push and pull transistors coupled in series to each other, and a mirror transistor coupled to the push transistors, the mirror transistor mirrors one of the first and second currents to the push transistor, and the mirrored current serves to bias the pull transistor.

2. The differential amplifier of claim 1, further comprising:
a voltage common mode feedback circuit, coupled to the second amplifier stage and the first amplifier stage, configured to adjust the second stage differential output signals to match with a reference voltage by feeding back a voltage difference of an averaged voltage of the second stage differential output signals and the reference voltage to the first amplifier stage, and comprising:
a reference voltage generation circuit, coupled to the voltage common mode feedback circuit, comprising a third transistor, a first amplifier and a reference current source, wherein the first amplifier sets a third drain voltage of the third transistor to an external applied reference voltage, the reference current source supplies the desired quiescent current to the third drain of the third transistor.

3. The differential amplifier of claim 2, wherein the bias circuit comprises:
a second amplifier, configured to set drain voltages of the first and second control transistors to a third gate voltage of the third transistor and output a current common mode control signal; and
a bias transistor, coupled to the second amplifier, configured to provide the current biasing to the first and second control transistors based on the current common mode control signal.

4. The differential amplifier of claim 1, wherein:
the bias circuit comprises a current source, configured to carry twice of the desired quiescent current.

5. The differential amplifier of claim 1, wherein:
the first amplifier stage further comprises a level shift resistor which increases voltage levels of the first stage differential output signals.

6. The differential amplifier of claim 1, wherein:
the bias circuit comprises first and second current sources, each is configured to carry the desired quiescent current to provide current biasing to one of the first and second control transistors.

7. The differential amplifier of claim 6, wherein:
the mirror transistor and the push transistor has a first size ratio of 2:n, where n is an integer; and
one of the first and second transistor and the pull transistor has a second size ratio of 1:n.

8. A method of amplifying a signal, adopted by a differential amplifier, comprising:
generating first stage differential output signals based on input differential signals;
providing, by a current source, a bias current with a desired quiescent current;
biasing first and second control transistors with the bias current to generate first and second currents, respectively, wherein the first and second control transistors form a differential pair which receives the first stage differential output signals;
mirroring the first and second currents to first and second push transistors which are connected to first and second pull transistors in series, respectively;
biasing the first and second pull transistors with the mirrored first and second currents from the first and second push transistors, respectively;
wherein each pair of serial connected push and pull transistors are complimentary and the two pairs of push and pull transistors output second stage differential output signals;
providing, by a reference current source, current biasing to a third drain of a third transistor;
setting, by a first amplifier, a third drain voltage of the third transistor to an external applied reference voltage; and
adjusting the second stage differential output signals to match with the external reference voltage by feeding back a voltage difference of an averaged voltage of the second stage differential output signals and the external reference voltage to the first amplifier stage.

9. The method of claim 8, further comprising:
setting, by a second amplifier, drain voltages of the first and second control transistors to a third gate voltage of the third transistor;
outputting, by the second amplifier, a current common mode control signal, and
providing, by a bias transistor, the current biasing to the first and second control transistors based on the current common mode control signal.

* * * * *